(12) United States Patent
Zhang et al.

(10) Patent No.: US 8,476,002 B2
(45) Date of Patent: *Jul. 2, 2013

(54) METHODS OF FORMING PATTERNED MASKS

(75) Inventors: Zishu Zhang, Boise, ID (US); Anton J. deVilliers, Boise, ID (US); Robert Carr, Boise, ID (US); Farrell Good, Meridian, IA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/609,027

(22) Filed: Sep. 10, 2012

(65) Prior Publication Data

US 2013/0004889 A1    Jan. 3, 2013

Related U.S. Application Data

(63) Continuation of application No. 12/940,802, filed on Nov. 5, 2010, now Pat. No. 8,288,083.

(51) Int. Cl.
*G03F 7/26* (2006.01)

(52) U.S. Cl.
USPC ............ 430/325; 430/322; 430/323; 430/324

(58) Field of Classification Search
USPC .......................... 430/311, 322, 323, 324, 329
See application file for complete search history.

(56) References Cited

U.S. PATENT DOCUMENTS

| | | | |
|---|---|---|---|
| 5,691,433 | A | 11/1997 | Kotani et al. |
| 7,696,101 | B2 | 4/2010 | Li |
| 7,709,390 | B2 | 5/2010 | Olson |
| 7,732,343 | B2 | 6/2010 | Niroomand et al. |
| 2009/0273051 | A1 | 11/2009 | Parekh et al. |
| 2010/0062579 | A1 | 3/2010 | Juengling et al. |
| 2010/0144150 | A1 | 6/2010 | Sills et al. |
| 2010/0167520 | A1 | 7/2010 | Chen et al. |

OTHER PUBLICATIONS

Wang, "Double, Triple and Quadruple Patterning and Future Lithoography", posted Jun. 23, 2009, NextBigFuture Blog, a Lifeboat Foundation Technology Research News Website. Downloaded on Oct. 5, 2010.

*Primary Examiner* — Kathleen Duda
(74) *Attorney, Agent, or Firm* — Wells St. John P.S.

(57) ABSTRACT

Some embodiments include methods in which spaced-apart first features are formed from a first material having a reflow temperature. Second material is formed along sidewalls of the first features, and third material is formed over the second material and the first features. The third material may be formed at a temperature above the reflow temperature of the first material, and the second material may support the first features so that the first features do not collapse even though they are exposed to such temperature. In some embodiments the third material has an undulating topography. Fourth material may be formed within the valleys of the undulating topography, and subsequently the first features may be removed together with at least some of the third material to leave a pattern comprising second features formed from the second material and pedestals formed from the fourth material.

16 Claims, 15 Drawing Sheets

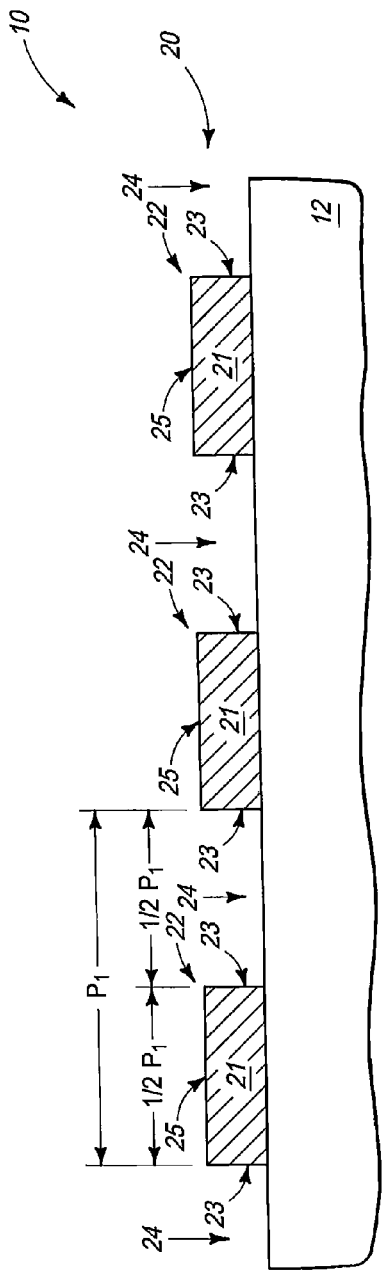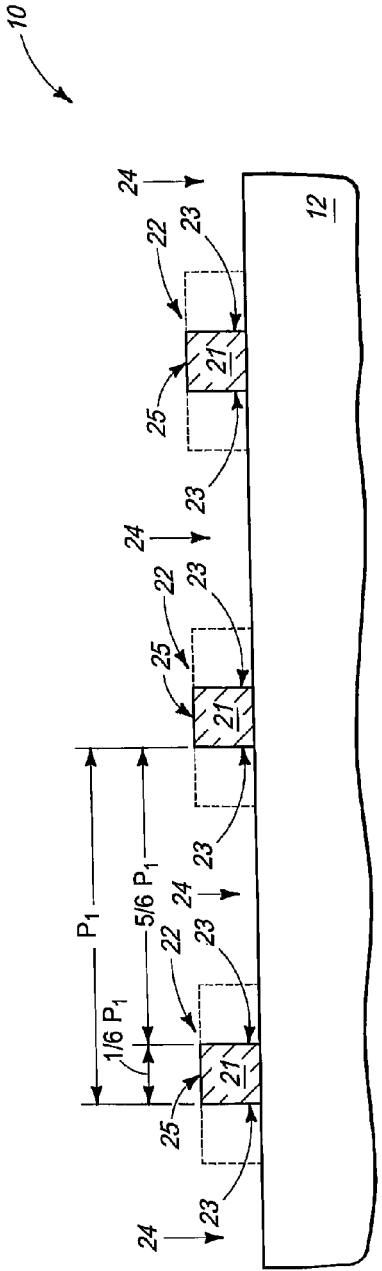

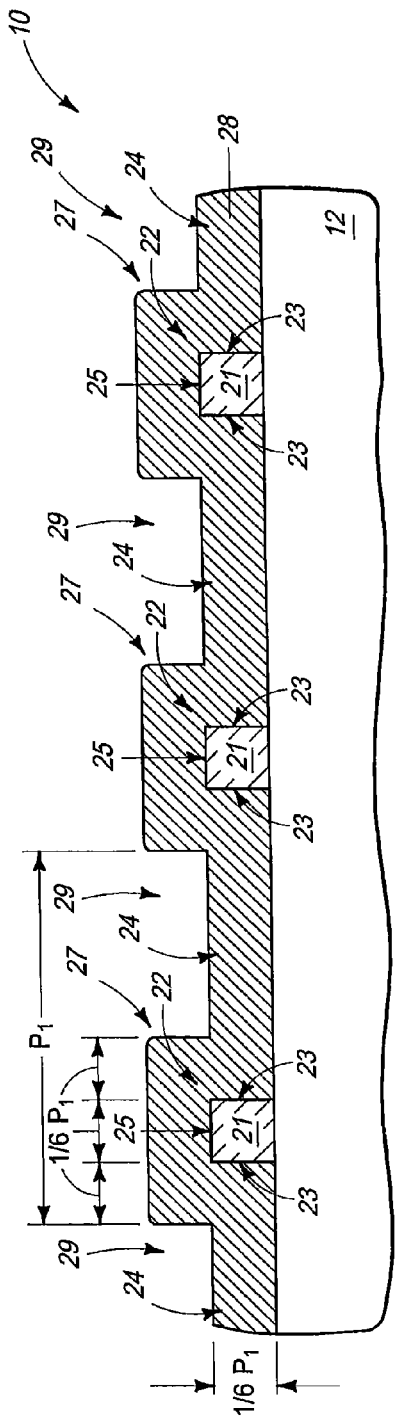
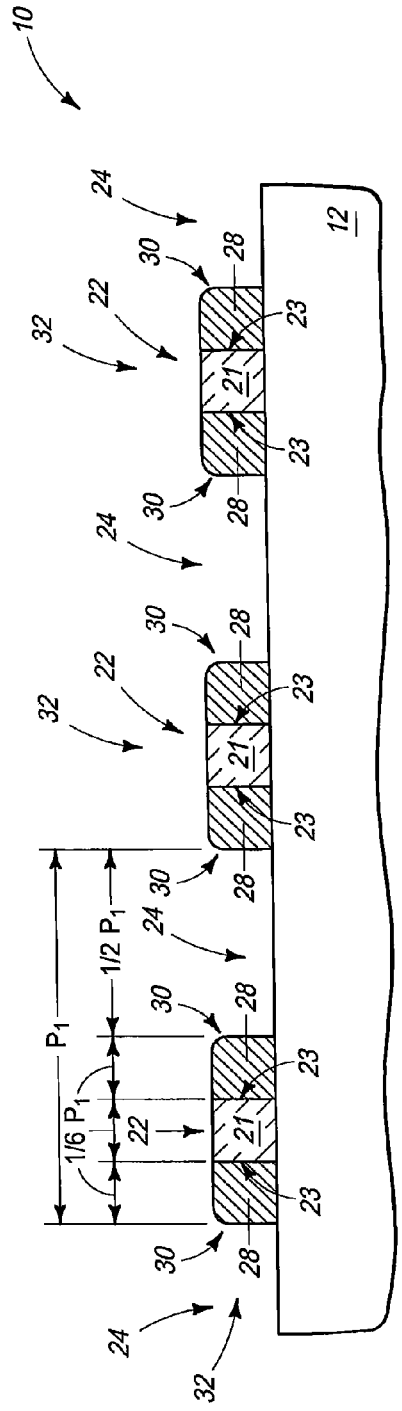

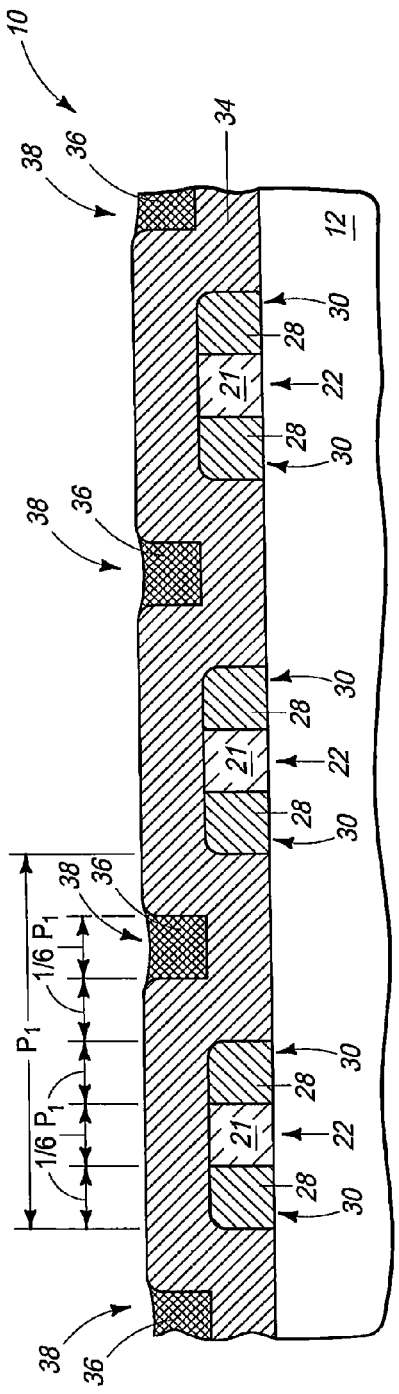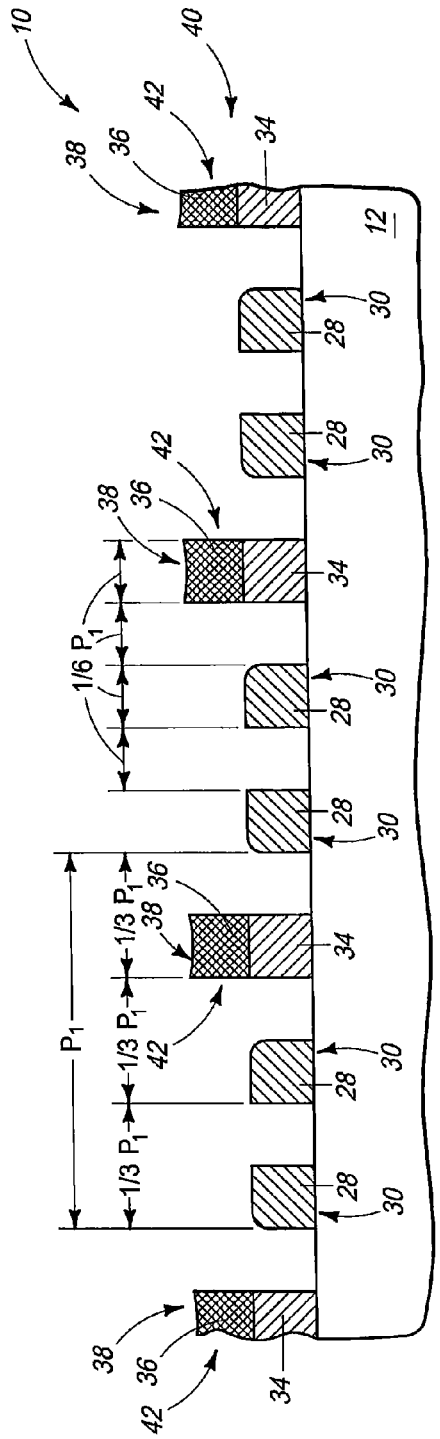

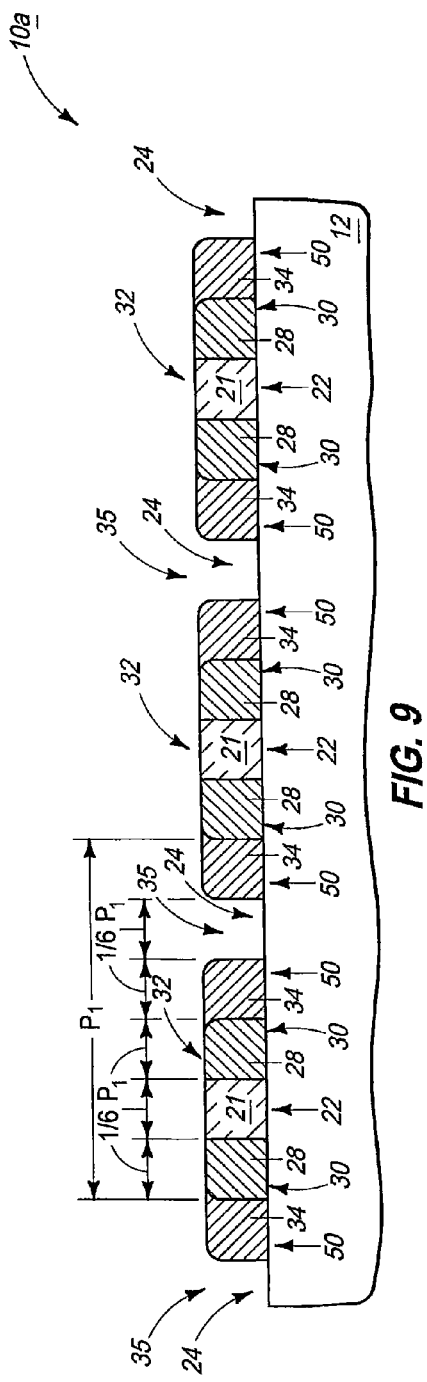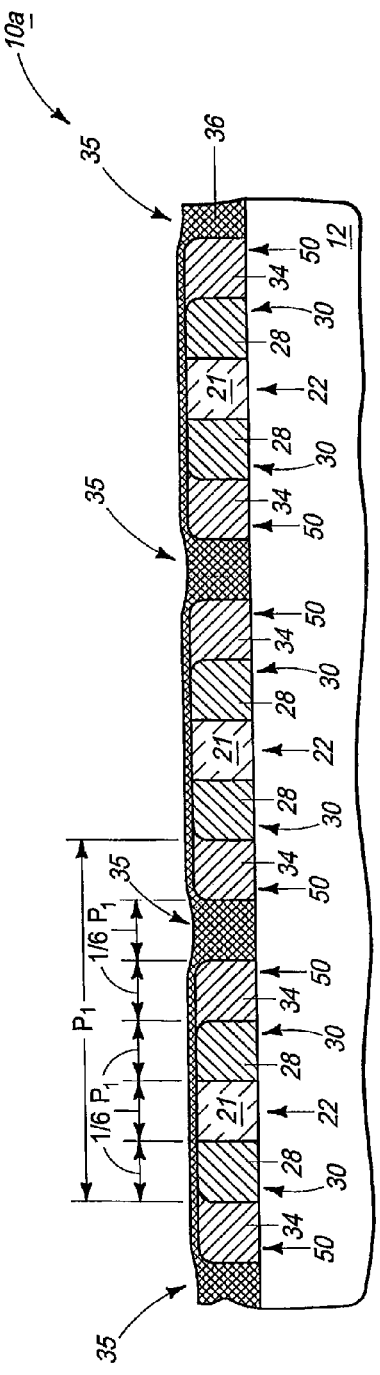

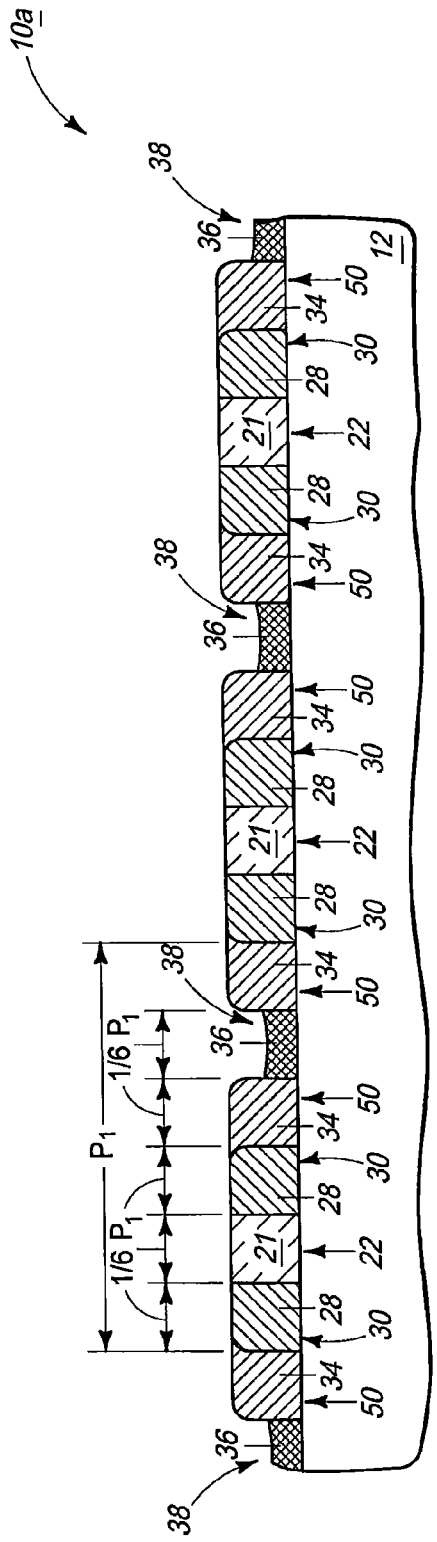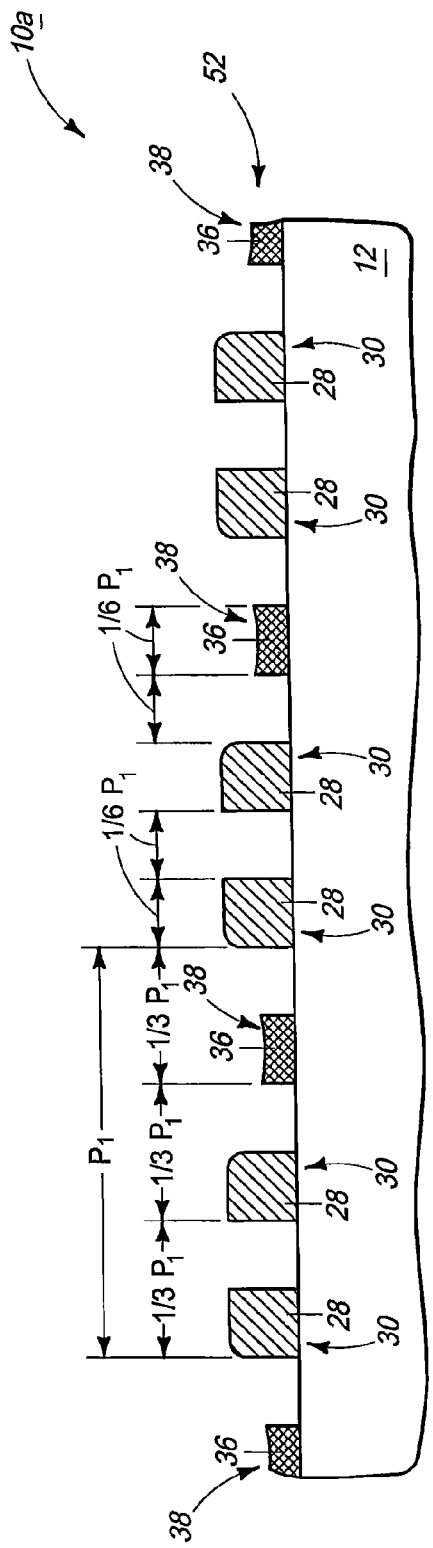

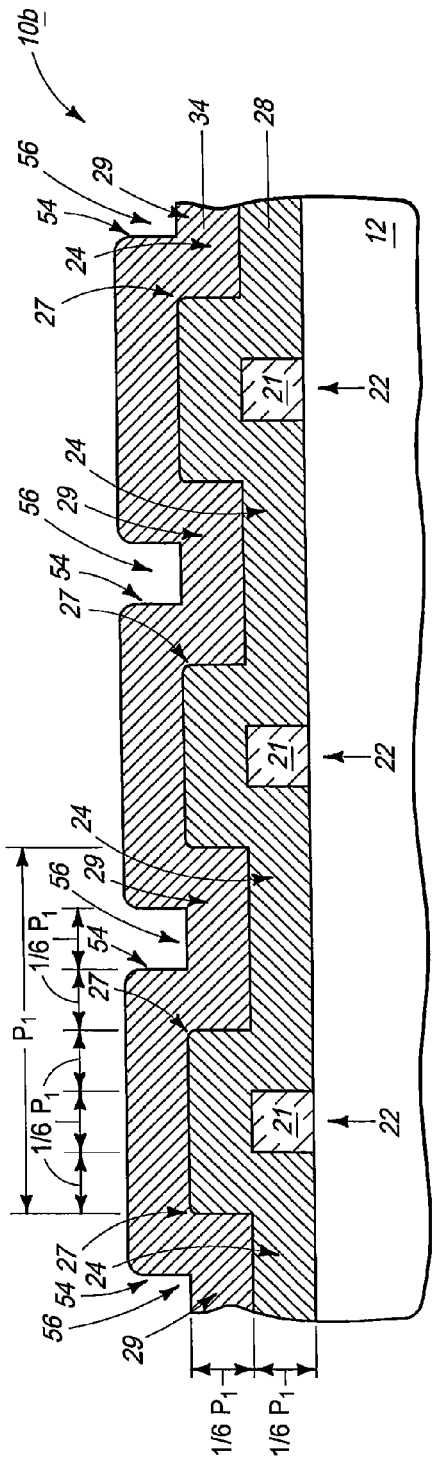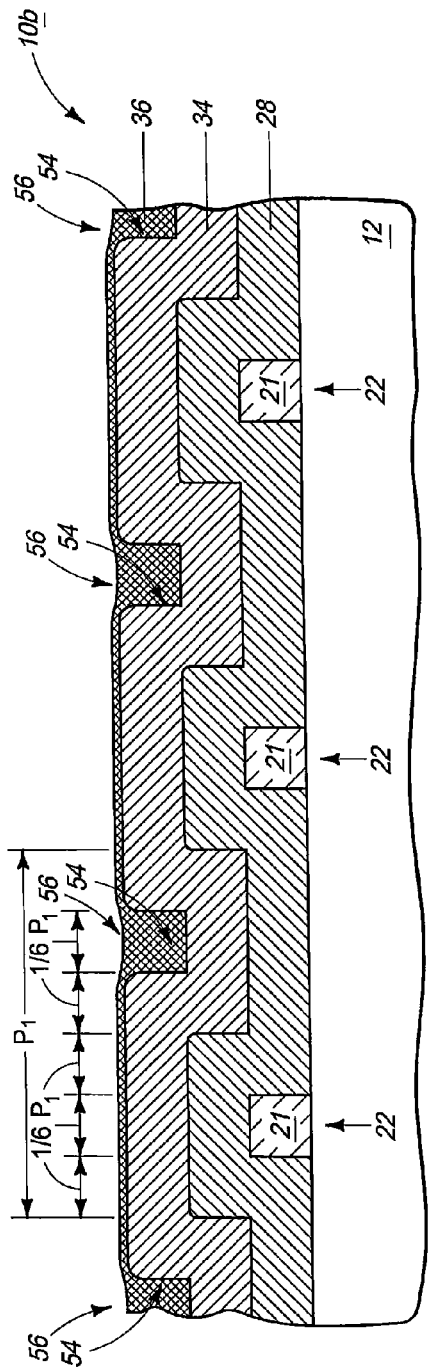

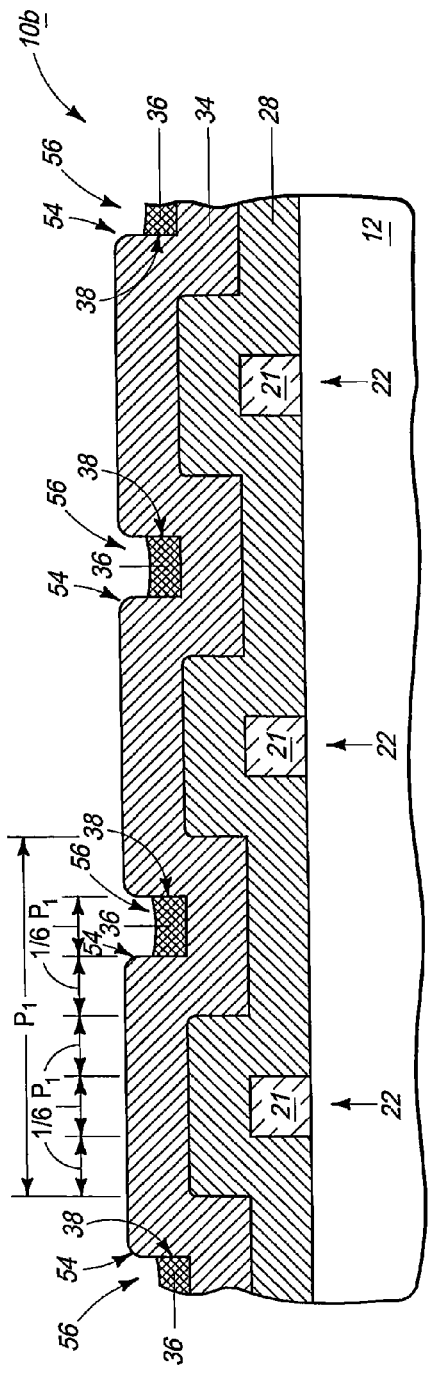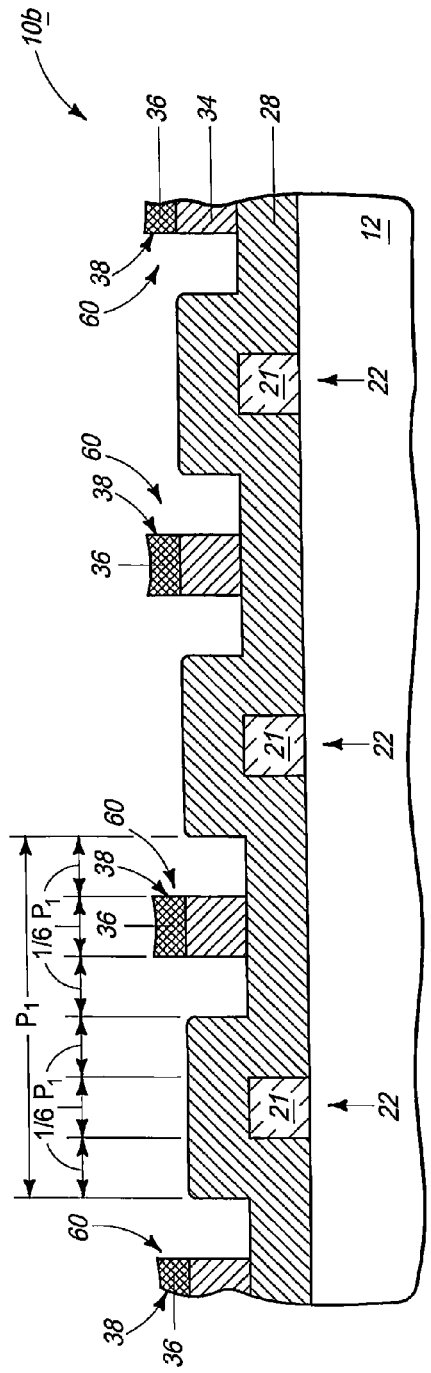

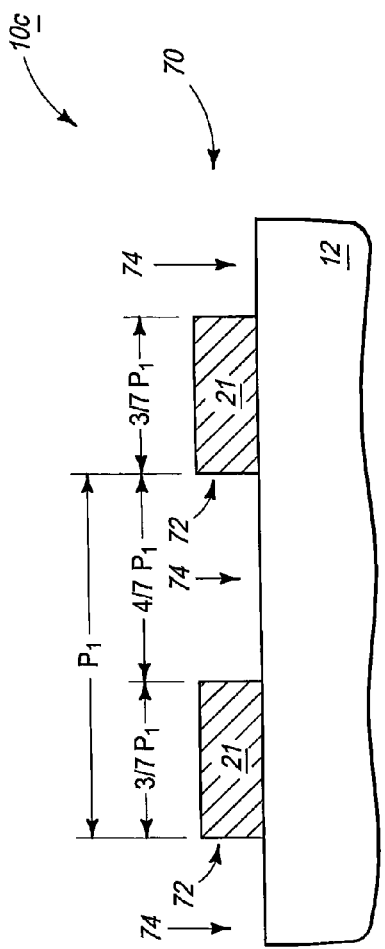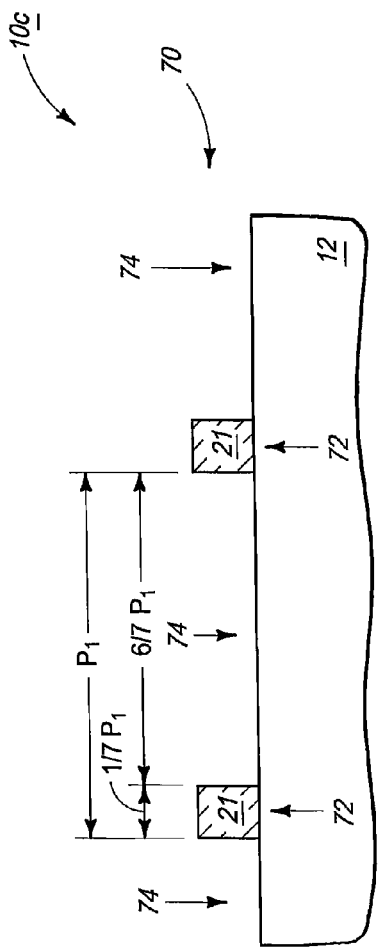

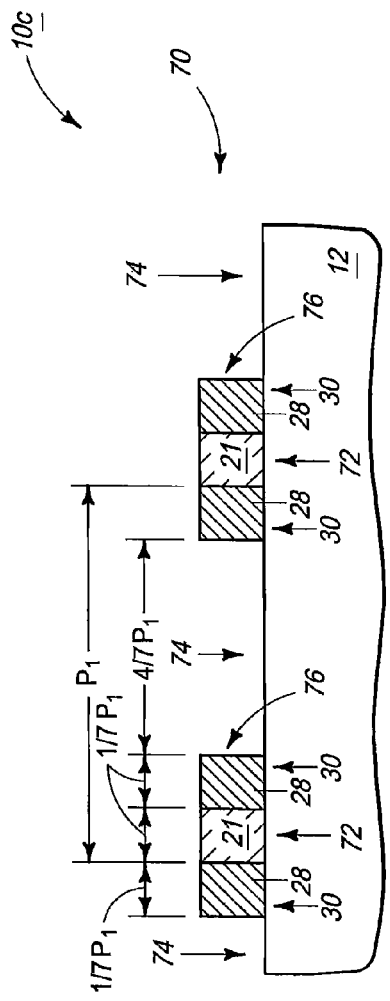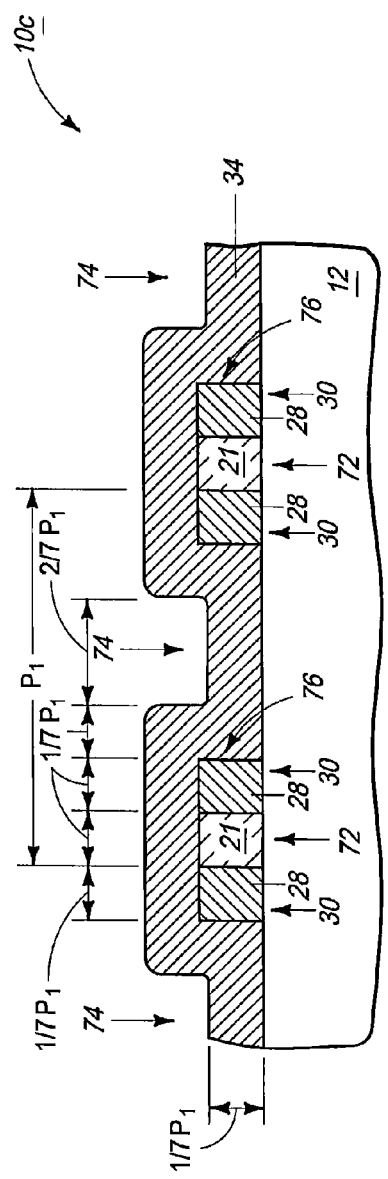

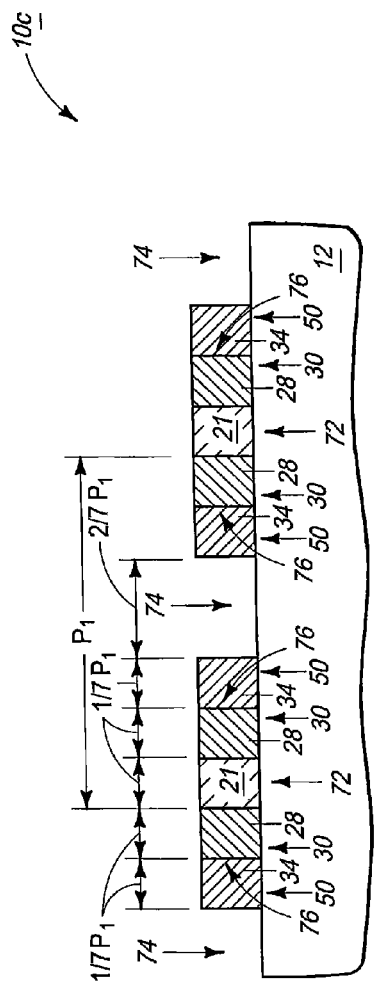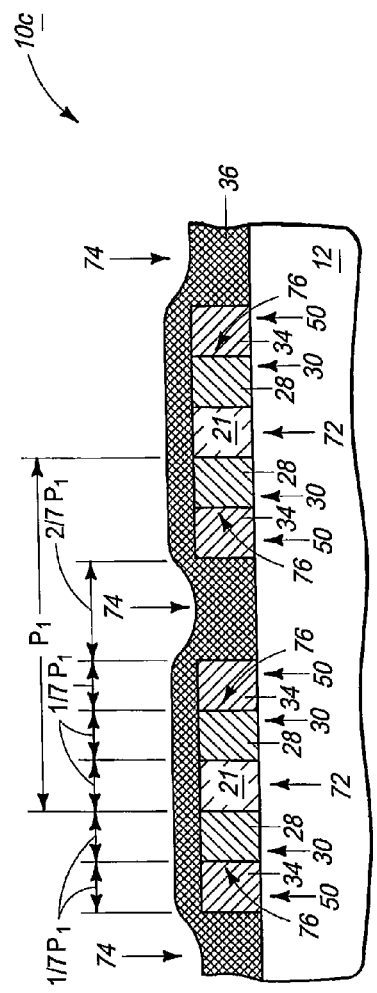

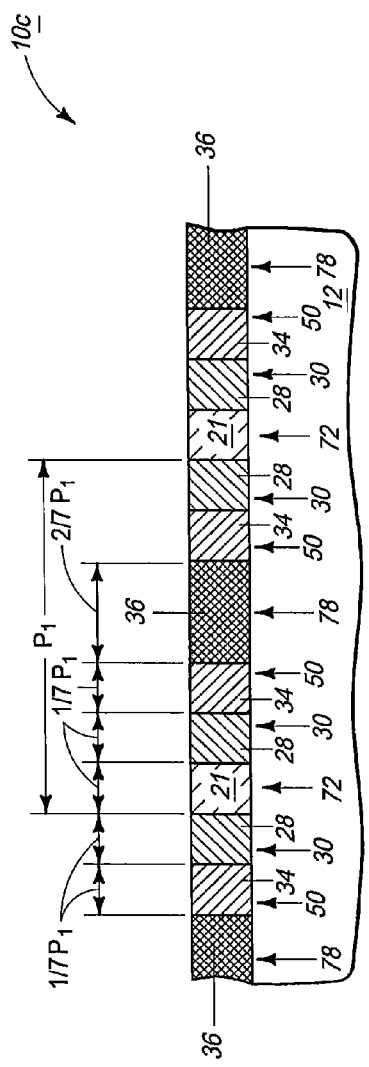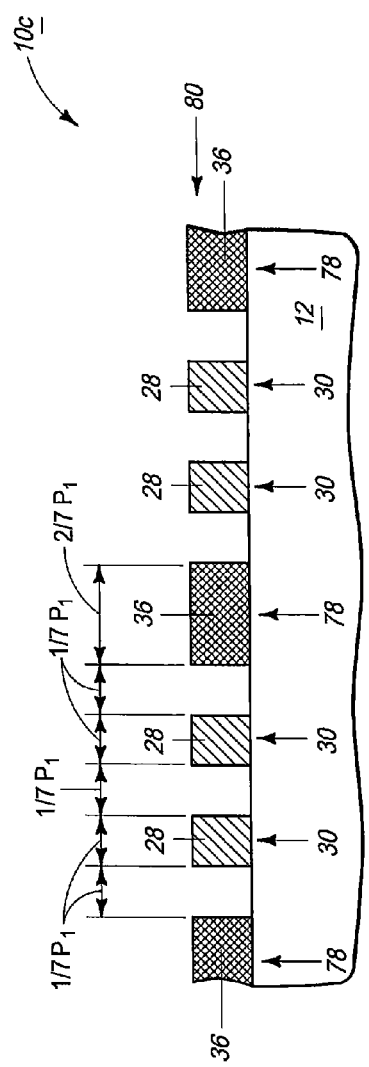
FIG. 25
FIG. 26

METHODS OF FORMING PATTERNED MASKS

RELATED PATENT DATA

This patent resulted from a continuation of U.S. patent application Ser. No. 12/940,802, which was filed Nov. 5, 2010, which issued as U.S. Pat. No. 8,288,083, and which is hereby incorporated herein by reference.

TECHNICAL FIELD

Methods of forming patterned masks.

BACKGROUND

Integrated circuits may be formed on a semiconductor substrate, such as a silicon wafer or other semiconducting material. In general, layers of various materials which are either semiconducting, conducting or insulating are patterned to form components of the integrated circuits. By way of example, the various materials are doped, ion implanted, deposited, etched, grown, etc., using various processes.

Photolithography is commonly utilized during integrated circuit fabrication. Photolithography comprises patterning of photoresist by exposing the photoresist to a pattern of actinic energy, and subsequently developing the photoresist. The patterned photoresist may then be used as a mask, and a pattern may be transferred from the photolithographically-patterned photoresist to underlying materials.

A continuing goal in semiconductor processing is to reduce the size of individual electronic components, and to thereby enable smaller and denser integrated circuitry. A concept commonly referred to as "pitch" can be used to quantify the density of an integrated circuit pattern. Pitch may be defined as the distance between an identical point in two neighboring features of a repeating pattern. Due to factors such as optics and actinic radiation wavelength, a photolithographic technique will tend to have a minimum pitch below which the particular photolithographic technique cannot reliably form features. Thus, minimum pitches associated with photolithographic techniques present obstacles to continued feature size reduction in integrated circuit fabrication.

Pitch multiplication, such as pitch doubling, is one proposed method for extending the capabilities of photolithographic techniques beyond their minimum pitch. Pitch multiplication refers to methodologies which reduce pitch relative to a starting pitch of a photoresist template. For instance, a pitch-doubling process is a process which forms a mask having a pitch that is about one-half of the pitch of the starting photoresist template.

Pitch multiplication methodology may involve forming features narrower than minimum photolithographic resolution by depositing layers to have a lateral thickness which is less than that of the minimum capable photolithographic feature size. The layers may be anisotropically etched to form sub-lithographic features. The sub-lithographic features may then be used as a patterned mask. For instance, the sub-lithographic features may be used for integrated circuit fabrication to create higher density circuit patterns than can be achieved with conventional photolithographic processing.

It is desired to develop new methodologies for pitch multiplication, and to develop processes for applying such methodologies to integrated circuit fabrication.

BRIEF DESCRIPTION OF THE DRAWINGS

FIGS. 1-8 are diagrammatic cross-sectional views of a portion of a semiconductor construction at various steps of an example embodiment method.

FIGS. 9-12 are diagrammatic cross-sectional views of a portion of a semiconductor construction at various steps of another example embodiment method. The processing stage of FIG. 9 may follow that of FIG. 5 in some embodiments.

FIGS. 13-18 are diagrammatic cross-sectional views of a portion of a semiconductor construction at various steps of another example embodiment method. The processing stage of FIG. 13 may follow that of FIG. 3 in some embodiments.

FIGS. 19-26 are diagrammatic cross-sectional views of a portion of a semiconductor construction at various steps of another example embodiment method.

DETAILED DESCRIPTION OF THE ILLUSTRATED EMBODIMENTS

Some embodiments include methods for pitch multiplication in which photolithographically-patterned photoresist is formed to a first pitch, and is utilized as a starting template for aligning numerous other materials. Ultimately, the other materials are formed into a second pattern having a pitch which is substantially reduced relative to the first pitch. In some embodiments the second pitch may be a factor of the first pitch (i.e., may be 1/n of the first pitch, where n is any positive number). In some embodiments the second pattern may have a pitch that is about ⅓ of the pitch of the patterned photoresist template.

In some embodiments at least one of the materials formed over the photoresist is formed at a temperature which is above a reflow temperature of the photoresist, and thus the photoresist may be subjected to temperature exceeding its reflow temperature. Prior art methods would avoid such processing, since it would be expected that the photoresist features would collapse when a temperature of the photoresist features exceeds the reflow temperature of the photoresist. However, some embodiments disclosed herein form structures directly adjacent the photoresist features prior to the exposure of the photoresist features to the temperatures that are above the photoresist reflow temperature. Such structures can support the photoresist features to avoid collapse of the photoresist features even though the photoresist features may soften. The photoresist features may be subsequently removed, and in some embodiments the structures that had been provided adjacent the photoresist features may remain as part of a mask having sub-lithographic pitch.

Figure 27:
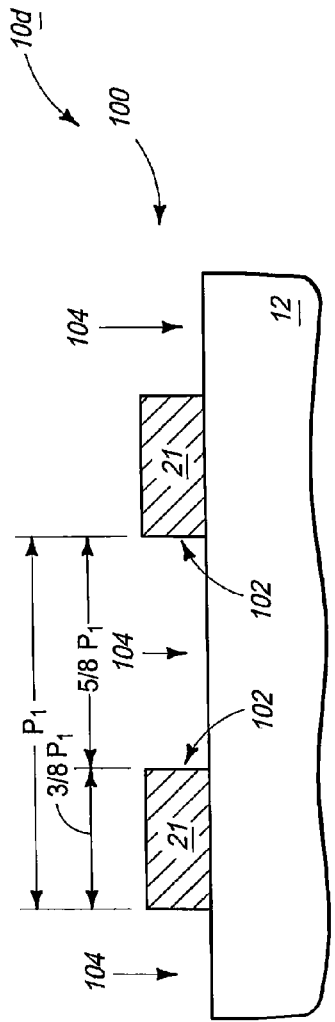
FIGS. 27-29 are diagrammatic cross-sectional views of a portion of a semiconductor construction at various steps of another example embodiment method.
Figure 28:
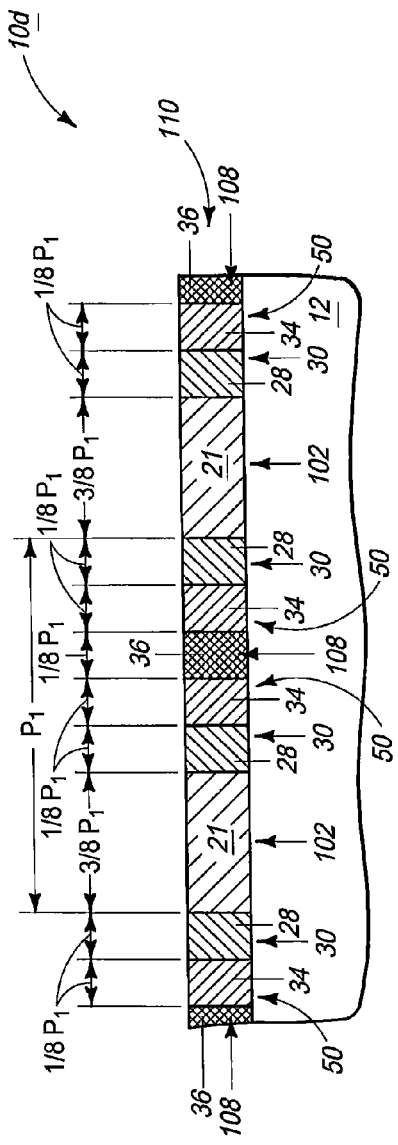
Figure 29:
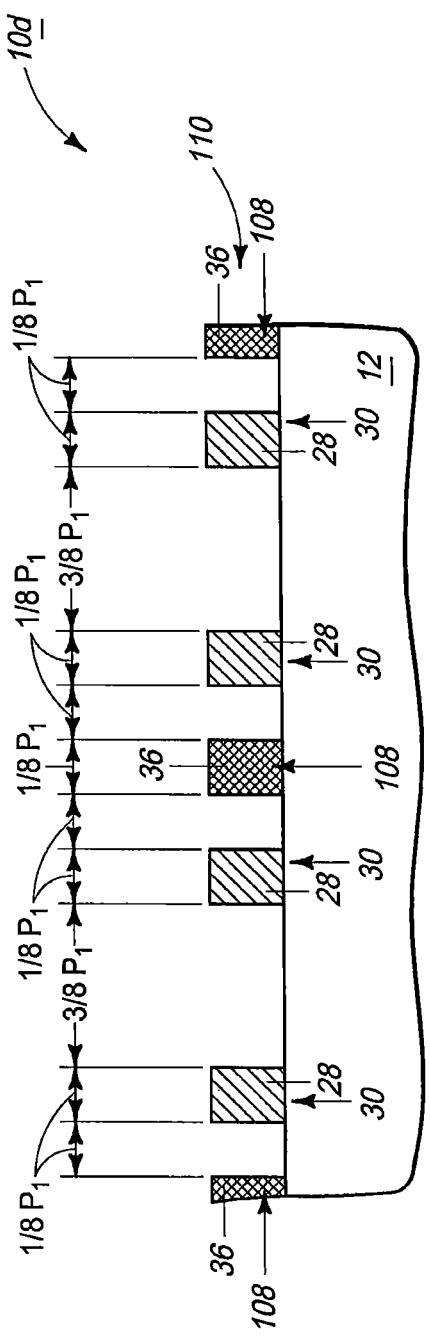

Example embodiments of methods of forming patterns are described with reference to FIGS. 1-29; with FIGS. 1-8 showing a first example embodiment, FIGS. 9-12 showing a second example embodiment, FIGS. 13-18 showing a third example embodiment, FIGS. 19-26 showing a fourth example embodiment, and FIGS. 27-29 showing a fifth example embodiment.

Referring to FIG. 1, such shows a construction 10 that comprises a base 12 and a patterned mask 20 over the base.

Base 12 comprises one or more materials which ultimately are to be patterned. The base is shown to be homogeneous in FIG. 1 in order to simplify the drawing, but often is heterogeneous. In some embodiments the base may comprise semiconductor material (for instance, monocrystalline silicon of a silicon wafer) supporting one or more materials that are ultimately to be patterned into structures utilized in integrated circuitry. The various materials may comprise, for example, one or more of various semiconductive materials, insulative materials, and conductive materials. If base 12 comprises semiconductor material, the base may be referred to as a semiconductor substrate or semiconductor construction; with the terms "semiconductor substrate" and "semiconductor construction" meaning any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductor substrates described above.

Patterned mask 20 comprises a material 21. Such material may, for example, comprise, consist essentially of, or consist of photoresist. If material 21 is photoresist, the material may be formed into the shown pattern with photolithographic processing (i.e., by exposing the photoresist to patterned actinic radiation, followed by utilization of developer to selectively remove some regions of the photoresist). The material 21 may have a reflow temperature. Material 21 softens at a temperature equal to or greater than the reflow temperature. At temperatures far above the reflow temperature, material 21 may reticulate (i.e., turn into carbon-containing flakes or otherwise burn). In some embodiments material 21 may reach a temperature which is above the reflow temperature such that the material softens, but the material 21 does not reach a temperature high enough to cause the material to reticulate. A reflow temperature of some photoresist compositions is about 180° C.

The patterned mask 20 comprises a plurality of blocks 22 which are spaced apart by gaps 24. In some embodiments the blocks may correspond to lines extending in and out of the page relative to the shown cross-section of FIG. 1.

In the shown embodiment the blocks 22 and gaps 24 are formed to a pitch $P_1$, with individual blocks having widths $$\frac{1}{2}P_1,$$

and with individual gaps having widths $$\frac{1}{2}P_1.$$

In some embodiments the width $$\frac{1}{2}P_1$$

may correspond to a minimum photolithographic feature dimension that may be formed with the photolithographic processing utilized to create patterned mask 20, and thus the pitch $P_1$ may correspond to a minimum pitch that can be created with such photolithographic processing.

Although the gaps and blocks are shown having the same widths as one another, in other embodiments at least some of the gaps may have widths different than at least some of the blocks (example embodiments in which blocks and gaps have different widths relative to one another are described below with reference to FIGS. 19-29). In some embodiments one or more of the blocks may be formed to a different width than one or more of the other blocks, and/or one or more of the gaps may be formed to a different width than one or more of the other gaps.

Each of the blocks 22 comprises a pair of opposing sidewall surfaces 23, and a top surface 25 extending between the opposing sidewall surfaces.

Referring to FIG. 2, the blocks 22 of the mask 20 have been laterally trimmed to remove $$\frac{1}{6}P_1$$

from each side of the individual blocks, and to thus reduce the widths of the blocks to about $$\frac{1}{6}P_1.$$

Such lateral trimming also causes a corresponding change in the widths of gaps 24, and specifically increases the widths of the gaps from the dimension of about $$\frac{1}{2}P_1$$

of FIG. 1 to a dimension of about $$\frac{5}{6}P_1.$$

The pitch across the construction of FIG. 2 remains $P_1$, and thus the pitch is unaltered by the lateral trimming.

The lateral trimming of blocks 22 moves sidewalls 23 inwardly. The original locations of sidewalls 23 (i.e., the locations of the sidewalls at the processing stage of FIG. 1) is shown in FIG. 2 in dashed-line view to assist the reader in understanding the dimensional changes that occurred to the blocks 22 through the lateral trimming. Although the tops 25 of the blocks 22 are shown to be unaffected by the lateral trimming, in some embodiments the lateral trimming conditions may decrease the heights of blocks 22 and/or may induce other changes to the blocks (e.g., may impose a dome-shape to the blocks). For instance, lateral trimming conditions may be chosen which isotropically etch blocks 22.

The lateral trimming of blocks 22 may be omitted in some embodiments. If the lateral trimming is utilized, such lateral trimming may be accomplished with any suitable processing. For example, the construction depicted in FIG. 2 may be derived by plasma etching the substrate of FIG. 1 within an inductively coupled reactor. Example etching parameters which will achieve essentially isotropic etching where material of blocks 22 is photoresist and/or other organic-comprising material are pressure from about 2 mTorr to about 50 mTorr, substrate temperature from about 0° C. to about 100° C., source power from about 150 watts to about 500 watts, and bias voltage at less than or equal to about 25 volts. An example etching gas is a combination of $Cl_2$ from about 20 standard cubic centimeters per minute (sccm) to about 100 sccm and $O_2$ from about 5 sccm to about 50 sccm. If blocks 22 comprise a photoresist, such plasma etching will isotropically etch mask blocks 22 at a rate from about 0.2 nanometers per second to about 3 nanometers per second. While such an example etch is essentially isotropic, there may be more lateral etching of the blocks than vertical etching since each blocks has two sides laterally exposed, and only a single top surface vertically exposed.

If even more lateral etching is desired in comparison to vertical etching, example parameter ranges in an inductively coupled reactor may include pressure from about 2 mTorr to about 20 mTorr, source power from about 150 watts to about 500 watts, bias voltage at less than or equal to about 25 volts, substrate temperature of from about 0° C. to about 110° C., $Cl_2$ and/or HBr flow from about 20 sccm to about 100 sccm, $O_2$ flow from about 5 sccm to about 20 sccm, and $CF_4$ flow from about 80 sccm to about 120 sccm.

The blocks 22 remaining after the lateral etching (i.e., the blocks 22 remaining at the processing stage of FIG. 2) may be referred to as first features 22 of a mask template in some embodiments. In other embodiments, the lateral etching of FIG. 2 may be omitted, and the blocks 22 of FIG. 1 may be directly utilized as the first features of the mask template.

Referring to FIG. 3, a second material 28 is formed over first features 22 and within the gaps 24 between the first features. The second material may be directly against the sidewalls 23 of the features, as shown. The second material 28 is formed substantially conformally across an undulating topography of the base 12 and features 22 so that the second material has an undulating topography. The undulating topography of material 28 has peaks 27 over the features 22, and has valleys 29 between the peaks.

In the shown embodiment the second material has a thickness of about $$\frac{1}{6}P_1.$$

In some embodiments the thickness of material 28 may be from about 100 Å to about 500 Å.

The second material 28 may comprise any suitable composition or combination of compositions, and is a material distinguishable from material 21 (i.e., compositionally different from material 21), as the material 21 is selectively etched relative to material 28 in subsequent processing (discussed below). In some embodiments material 28 may comprise, consist essentially of, or consist of silicon dioxide. Such silicon dioxide and may be formed by any suitable method, including, for example, one or both of atomic layer deposition (ALD) and chemical vapor deposition (CVD).

The second material 28 is formed directly along sidewalls 23 of features 22, and may provide structural support to such features during subsequent processing (discussed below).

Referring to FIG. 4, second material 28 is subjected to an anisotropic etch which forms features 30 from the second material, with such features 30 being along the sidewalls 23 of the features 22. The features 30 may be referred to as second features.

Features 30 are shown having widths of about $$\frac{1}{6}P_1,$$

and thus are shown reducing the widths of gaps 24 from the dimension of about $$\frac{5}{6}P_1$$

of FIG. 2, to a dimension of about $$\frac{1}{2}P_1.$$

In some embodiments the first and second features 22 and 30 may be together considered as forming a plurality of projections 32 over base 12, with each projection being a laminate structure containing a first feature 22 sandwiched between a pair of the second features 30.

Figure 5:
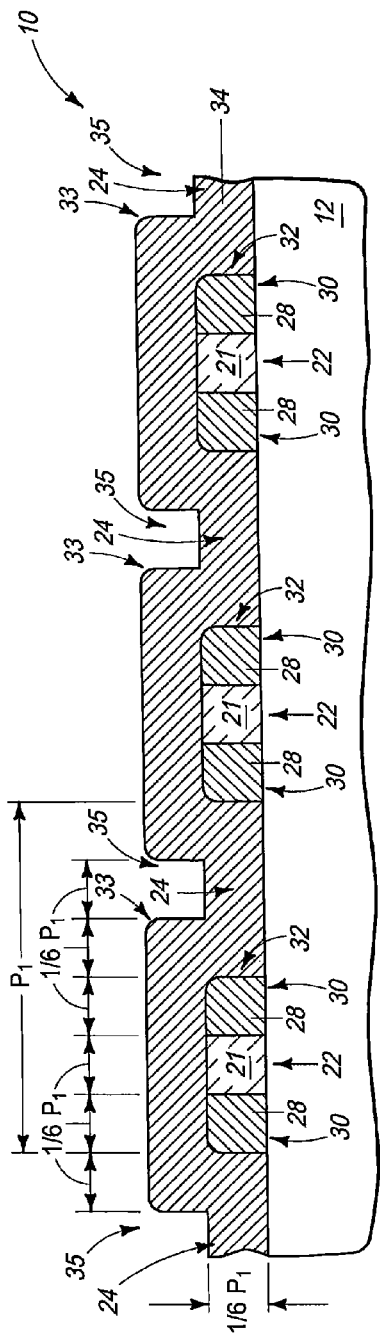

Referring to FIG. 5, a third material 34 is formed over the projections 32 and within the gaps 24 between such projections. In the shown embodiment the third material 34 is formed substantially conformally across base 12 and projections 32 so that the third material has an undulating topography. The undulating topography of material 34 has peaks 33 over the projections 32, and has valleys 35 between the peaks. In the embodiment illustrated in FIG. 5 the topography of the third material includes regions of the third material extending entirely across the gaps 24. The valleys define recesses over segments of gaps 24. In the shown embodiment the third material has a thickness of about $$\frac{1}{6}P_1,$$

and the valleys 35 have widths of about $$\frac{1}{6}P_1.$$

The third material 34 may comprise any suitable composition or combination of compositions, and may be a material distinguishable from material 28 during subsequent etching (for instance, material 34 is selectively etched relative to material 28 in example processing described below). In some embodiments material 34 may be a carbon-containing material; and may, for example, comprise, consist essentially of, or consist of a mixture of carbon and hydrogen. Material 34 may have compatible chemistry to achieve similar etch resistance as material 28 in some embodiments, rather than being selectively etchable relative to material 28.

If material 34 comprises carbon, the carbon-containing material may be formed by any suitable method, including, for example, utilization of one or more organic compositions (for instance, acetylene, toluene, methane, etc.) in a reaction chamber, while maintaining a temperature of construction 10 at less than or equal to about 200° C. (for instance, a temperature of construction 10 in the chamber may be about 150° C. or about 175° C.), while maintaining a plasma in the chamber, and while maintaining a pressure within the chamber within a range of from about 1 Torr to about 7 Torr. The carbon-containing material 34 may be formed to a thickness of less than or equal to about 200 Å in some embodiments; and, for example, may be formed as a thin film.

Notably, carbon-containing material 34 may be formed at a temperature above a reflow temperature of photoresist material 21. For instance, the material 34 may be formed under conditions such that the material 34 and the structures proximate material 34 are at temperatures above of the reflow temperature of photoresist material 21, and thus a temperature of the photoresist material may be elevated to above the reflow temperature of the photoresist material during formation of the material 34. In such embodiments, the second features 30 of material 28 may provide support to the photoresist material 21 when material 21 is above its reflow temperature so that the material 21 may soften without collapsing.

Figure 6:
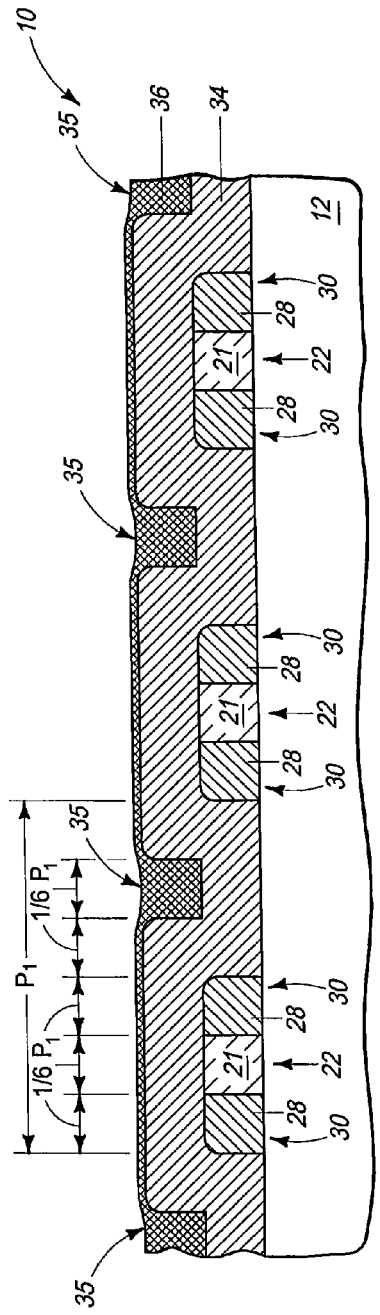

Referring to FIG. 6, a fourth material 36 is formed over third material 34. The fourth material substantially fills the valleys 35 defined by the undulating topography of the third material. The fourth material 36 may comprise any suitable composition or combination of compositions, and may be a material distinguishable from material 34 during subsequent etching (for instance, material 34 is selectively etched relative to material 36 in example processing discussed below), or may be a material with similar etch resistance as material 34. In some embodiments material 36 may comprise, consist essentially of, or consist of one or more of silicon-containing polymer (which may be analogous to a material described as SHB-MA001 in U.S. Pat. No. 7,696,101) and any of various metal-containing polymers (for instance, titanium-containing polymer, ruthenium-containing polymer, etc.).

Referring to FIG. 7, material 36 is subjected to an etch to remove material 36 from over material 34, and to thereby form a plurality of spaced-apart pedestals 38 from material 36. Each pedestal has a width of about $$\frac{1}{6}P_1.$$

Any suitable etch may be utilized for removing material 36 from over material 34, with an example etch being a so-called "bird's beak" etch utilizing hydrogen bromide and $CF_4$ under dry etching conditions.

Referring to FIG. 8, etching is conducted to anisotropically remove materials 21 and 34 (FIG. 7) selectively relative to materials 28 and 36. The anisotropic etch forms features 42 which are composites of materials 36 and 34. Specifically, the features 42 comprise the pedestals 38 of material 36, and further comprise segments of the material 34 that were directly under such pedestals. The etching utilized to selectively remove materials 21 and 34 may comprise any suitable etch or combination of etches, and in some embodiments may utilize one or both of $O_2$ and $SO_2$ to selectively remove organic materials relative to non-organic materials. The term "selective etch" means an etch that removes a first material faster than a second material, which can include, but is not limited to, etches which are 100% selective for the first material relative to the second material.

The features 30 and 42 together form a patterned mask 40 over base 12. The patterned mask 40 may be referred to as a second patterned mask to distinguish it from the first patterned mask 20 of FIG. 1. In the shown embodiment the second patterned mask 40 comprises an equal spacing of about $$\frac{1}{6}P_1$$

between adjacent features, and each of the features has a width of about $$\frac{1}{6}P_1.$$

Thus, the second patterned mask 40 has a pitch of about $$\frac{1}{3}P_1,$$

or in other words has a pitch multiple of about three (i.e., a pitch reduced by about a factor of three) relative to the pitch $P_1$ of the first patterned mask. In other embodiments, other levels of pitch modification may be achieved utilizing processing analogous to that of FIGS. 1-8 to achieve any desired pitch multiple (n) so that a final pitch may be about $$\frac{1}{n}P_1.$$

The mask 40 may be utilized for patterning structures of any of numerous devices during integrated circuit fabrication; such as; for example, gates or other components utilized for memory devices (for instance, gates of NAND devices), components utilized for logic devices, and/or wiring. In some applications the patterned mask 40 may be utilized for imparting an etch pattern or a dopant pattern into underlying base 12. For instance, in some embodiments an etch may be conducted subsequent to formation of mask 40, with such etch being selective for one or more materials of base 12 relative to materials of mask 40 to thereby transfer a pattern of mask 40 into base 12. As another example, dopant may be implanted into base 12 while using mask 40 to impart a pattern to the dopant implant.

The embodiment of FIGS. 1-8 forms features 42 comprising a combination of materials 34 and 36. In other embodiments, features analogous to the features 42 may be formed to only comprise material 36. An example embodiment in which such features are formed to comprise only material 36 is described with reference to FIGS. 9-12.

Referring to FIG. 9, a construction 10a is shown at a processing stage which may be subsequent to that of FIG. 5. The construction 10a comprises the first and second features 22 and 30 over base 12; with features 22 comprising the material 21 (which may be, for example, photoresist), and features 30 comprising the material 28 (which may be, for example, silicon dioxide). The first and second features 22 and 30 together form the plurality of projections 32; with each of such projections comprising a feature 22 sandwiched between a pair of features 30. Construction 10a also comprises the third material 34 (discussed above with reference to FIG. 5), and such third material has been anisotropically etched to form a plurality of third features 50 along sidewalls of the projections 32.

The third features 50 have widths of about $$\frac{1}{6}P_1.$$

The formation of third features 50 may be considered to reduce the widths of gaps 24 from the dimension of about $$\frac{1}{2}P_1$$

of FIG. 4 to a dimension of about $$\frac{1}{6}P_1.$$

Another way to consider the change between FIG. 4 and FIG. 9 is that the openings remaining between the third material features 50 are valleys (or recesses) 35 extending to base 12 and exposing segments of the gaps 24 of FIG. 4. Thus, two ways to consider the changes between FIG. 4 and FIG. 9 are: (1) that the features 50 extend into the gaps 24 of FIG. 4 to reduce the widths of such gaps; or (2) that the openings remaining between the third features expose segments of the gaps 24 of FIG. 4 while the features 50 cover other segments of the gaps 24.

Referring to FIG. 10, the fourth material 36 is formed over features 22, 30 and 50, and within the recesses 35.

Referring to FIG. 11, the fourth material 36 is subjected to an etch to remove material 36 from over features 22, 30 and 50, and to thereby form a plurality of spaced-apart pedestals 38 from material 36. Each pedestal has a width of about $$\frac{1}{6}P_1.$$

The removal of material 36 from over features 22, 30 and 50 may be accomplished with any suitable processing, including, for example, the "bird's beak" etch described above with reference to FIG. 7. The etching utilized to remove material 36 is shown to more dramatically affect the heights of pedestals 38 in FIG. 11 relative to the affect on the height of the pedestals 38 of FIG. 7. This difference is provided to illustrate that the amount of material 36 removed by a bird's beak etch may vary without detrimentally affecting a final pattern achieved by such etching. The amount of material 36 removed at the processing stage of FIG. 7 may resemble the shown amount at the processing stage of FIG. 11 in some embodiments, and/or the amount of material 36 removed at the processing stage of FIG. 11 may resemble the shown amount at the processing stage of FIG. 7 in some embodiments. Also, although none of materials 21, 28 and 34 is shown removed by the bird's beak etch of material 36, in some embodiments there may be some removal of portions of one or more of materials 21, 28 and 34 during such etch (i.e., the bird's beak etch may not be 100% selective for material 36 relative to one or more of materials 21, 28 and 34).

Referring to FIG. 12, materials 21 and 34 (FIG. 11) are selectively removed relative to materials 28 and 36. The processing utilized to selectively remove materials 21 and 34 may comprise any suitable etch or combination of etches, and in some embodiments may utilize one or both of $O_2$ and $SO_2$ to selectively remove organic materials relative to non-organic materials.

The features 30 and pedestals 38 together form a patterned mask 52 over base 12. In some embodiments, the pedestals 38 may be considered to form features analogous to the features 42 of FIG. 8; but comprising only material 36, rather than the combination of materials 34 and 36 of the features 42 of FIG. 8. The features 30 and pedestals 38 may be referred to as "structures" of the patterned mask 52. The patterned mask 52 may be referred to as a second patterned mask to distinguish it from the first patterned mask 20 of FIG. 1.

In the shown embodiment the second patterned mask 52 comprises an equal spacing of about $$\frac{1}{6}P_1$$

between adjacent first and second structures (30 and 38), and each of the structures (30 and 38) has a width of about $$\frac{1}{6}P_1.$$

Thus, the second patterned mask 52 has a pitch of about $$\frac{1}{3}P_1,$$

or in other words has a pitch multiple of about three (i.e., a pitch reduced by about a factor of three) relative to the pitch $P_1$ of the first patterned mask. In other embodiments, other levels of pitch modification may be achieved utilizing processing analogous to that of FIGS. 9-12.

The embodiments of FIGS. 1-12 formed patterned material 28 into features 30 (the processing step of FIG. 4) prior to forming material 34 (the processing step of FIG. 5). In other embodiments the material 28 may be patterned into features 30 subsequent to formation of material 34. An example embodiment in which material 28 is patterned into features 30 after formation of material 34 is described with reference to FIGS. 13-18.

Referring to FIG. 13, a construction 10b is shown at a processing stage subsequent to that of FIG. 3. The construction 10b comprises the first features 22 over base 12, and comprises the layer of second material 28 extending over the first features and across the gaps 24 between the first features. The layer of material 28 has the undulating topography discussed above relative to FIG. 3, and thus has the peaks 27 over the features 22, and has the valleys 29 between the peaks. Construction 10b also comprises a layer of the third material 34 formed substantially conformally across the topography of second material 28 so that the layer of material 34 has an undulating topography with peaks 54 over the peaks 27 of the second material 28, and with valleys 56 between the peaks 54. The valleys define recesses over segments of gaps 24. In the shown embodiment the second material 28 and the third material 34 have thicknesses of about $$\frac{1}{6}P_1,$$

and the valleys 56 have widths of about $$\frac{1}{6}P_1.$$

Referring to FIG. 14, the fourth material 36 is formed over material 34, and within the valleys 56.

Referring to FIG. 15, the fourth material 36 is subjected to an etch to remove material 36 from over the peaks 54, while leaving material 36 within the valleys 56 to thereby form a plurality of spaced-apart pedestals 38 from material 36. Each pedestal has a width of about $$\frac{1}{6}P_1.$$

The removal of material 36 from over the peaks 54 may be accomplished with any suitable processing, including, for example, the "bird's beak" etch described above with reference to FIG. 7.

Referring to FIG. 16, material 34 is anisotropically etched to form features 60 which are composites of materials 36 and 34.

Figure 17:
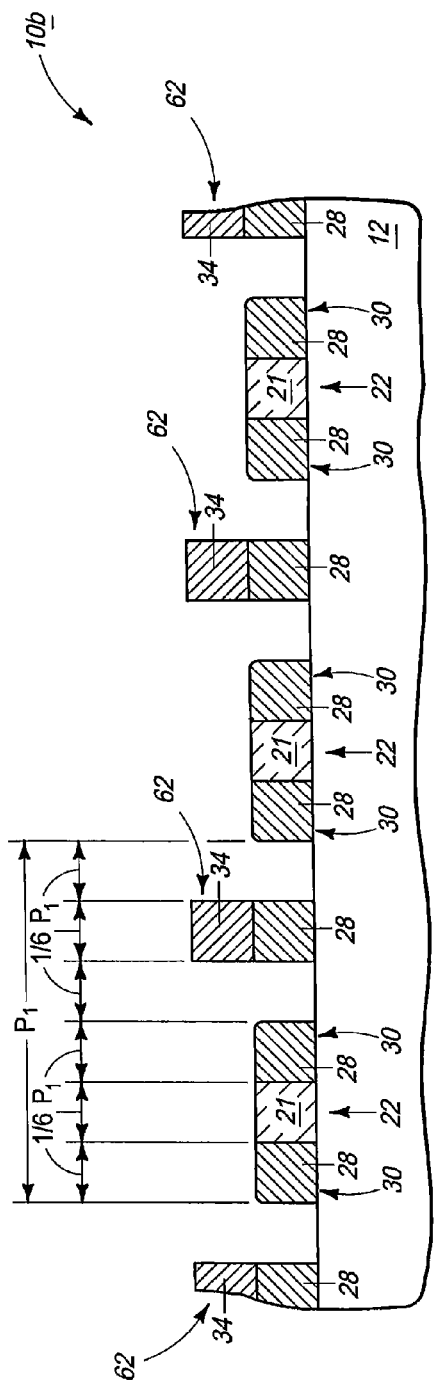

Referring to FIG. 17, material 28 is subjected to an anisotropic etch while using features 60 as a mask. The etch may be an oxide-based etch. Such etching forms the second features 30 from second material 28, and also forms features 62 which comprise a combination of materials 28 and 34. The material 36 of features 60 (FIG. 16) is shown to be removed by the anisotropic etch that penetrates through material 28 (which may occur in embodiments in which material 36 comprises polymer, and in which the etch through material 28 is an oxide-based etch). In other embodiments (not shown), material 36 may not be entirely removed by the etching conditions utilized to penetrate through material 28.

Figure 18:
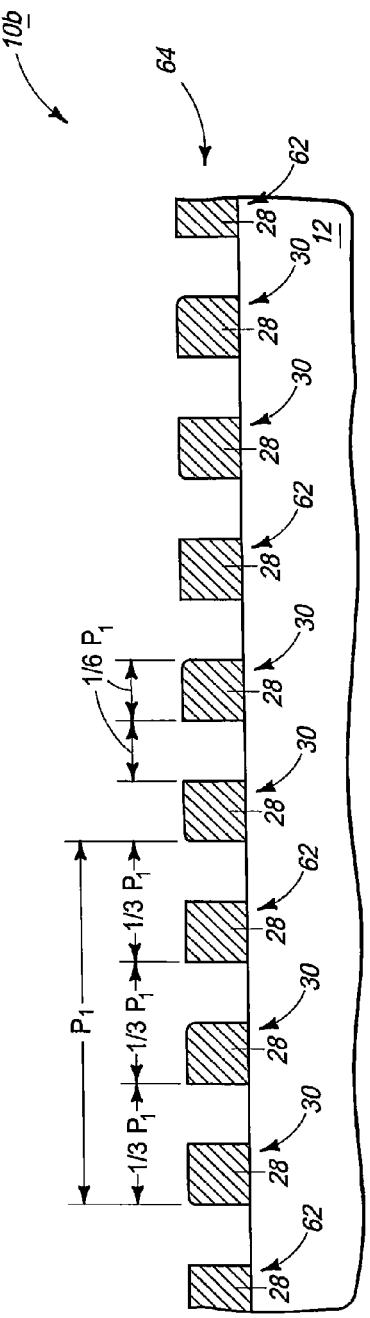

Referring to FIG. 18, materials 21 and 34 (FIG. 17) are removed, while leaving material 28. Accordingly, features 62 only comprise material 28 at the processing stage of FIG. 18. In some embodiments materials 21 and 34 may be removed with an etch utilizing one or both of $O_2$ and $SO_2$ to selectively remove organic materials relative to non-organic materials. Although all of materials 21 and 34 are removed in the shown embodiment, in other embodiments selective etching may be utilized to remove material 21 (FIG. 17) so that material 34 remains within features 62 at a processing stage analogous to that of FIG. 18.

The features 30 and 62 together form a patterned mask 64 over base 12 at the processing stage of FIG. 18. The features 30 and 62 are identical to one another in composition, which differs from the mask 40 of FIG. 8 (where features 30 and 42 differed in composition from one another) and the mask 52 of FIG. 12 (where structures 30 and 38 differed in composition from one another). It may be advantageous in some applications to have a mask in which all of the features are identical to one another in composition, as such can enable all of the features to be removed in a single etch step with a single etch chemistry.

The patterned mask 64 may be referred to as a second patterned mask to distinguish it from the first patterned mask 20 of FIG. 1. In the shown embodiment the second patterned mask 64 comprises an equal spacing of about $$\frac{1}{6}P_1$$

between adjacent first and second features (30 and 62), and each of the features (30 and 62) has a width of about $$\frac{1}{6}P_1.$$

Thus, the second patterned mask 64 has a pitch of about $$\frac{1}{3}P_1,$$

or in other words has a pitch multiple of about three (i.e., a pitch reduced by about a factor of three) relative to the pitch $P_1$ of the first patterned mask. In other embodiments, other levels of pitch modification may be achieved utilizing processing analogous to that of FIGS. 13-18.

The embodiments of FIGS. 1-18 formed patterned masks comprising equally sized and spaced features. In some embodiments it may be desired to have some of the features be wider than others and/or to have some of the spaces between the features be wider than others. In other words, in some embodiments the features may not all be substantially equal in size, and in some embodiments the features may not all be substantially equally spaced from one another. FIGS. 19-26 illustrate an example process for forming some of the features to be wider than others, and FIGS. 27-29 illustrate an example process for forming some of the spaces between the features to be wider than others.

Referring to FIG. 19, a construction 10c is shown at a processing stage analogous to that of FIG. 1. The construction 10c comprises a patterned mask 70 over base 12. The patterned mask 70 comprises a plurality of blocks 72 spaced apart from one another by gaps 74. In some embodiments the blocks 72 may correspond to lines extending in and out of the page relative to the shown cross-section of FIG. 19.

The blocks 72 and gaps 74 are formed to a pitch $P_1$. However, unlike the construction of FIG. 1, the construction 10c of FIG. 19 comprises the blocks 72 having different widths than the gaps 74 between the blocks. Specifically, the blocks 72 have widths $$\frac{3}{7}P_1,$$

and the gaps 74 have widths $$\frac{4}{7}P_1.$$

Referring to FIG. 20, the blocks 72 of the mask 70 have been laterally trimmed with processing analogous to that described above with reference to FIG. 2 to remove ⅓ of the total width from each side of the individual blocks. Such trimming reduces the widths of blocks 72 from the dimension of about $$\frac{3}{7}P_1$$

of FIG. 19 to a dimension of about $$\frac{1}{7}P_1.$$

Such lateral trimming also causes a corresponding change in the widths of gaps 74, and specifically increases the widths of the gaps from the dimension of about $$\frac{4}{7}P_1$$

of FIG. 19 to a dimension of about $$\frac{6}{7}P_1.$$

The pitch across the construction of FIG. 20 remains $P_1$, and thus the pitch is unaltered by the lateral trimming.

The blocks 72 remaining after the lateral etching (i.e., the blocks 72 remaining at the processing stage of FIG. 20) may be referred to as first features 72 of a mask template in some embodiments. In other embodiments, the lateral etching of FIG. 20 may be omitted, and the blocks 72 of FIG. 1 may be directly utilized as the first features of the mask template.

Referring to FIG. 21, second features 30 of second material 28 are formed along sidewalls of the first features 72 with processing analogous to that described above with reference to FIGS. 3 and 4.

The second features 30 are shown having widths of about $$\frac{1}{7}P_1,$$

and thus are shown reducing the widths of gaps 74 from the dimension of about $$\frac{6}{7}P_1$$

of FIG. 20, to a dimension of about $$\frac{4}{7}P_1.$$

In some embodiments the first and second features 72 and 30 may be together considered as forming a plurality of projections 76 over base 12, with each projection being a laminate structure containing a first feature 72 sandwiched between a pair of the second features 30.

Referring to FIG. 22, the third material 34 is formed over the projections 76. The third material is shown to have a thickness of about $$\frac{1}{7}P_1.$$

Referring to FIG. 23, third material 34 is anisotropically etched to form the third features 50 along sidewalls of the projections 76. The third features 50 have widths of about $$\frac{1}{7}P_1.$$

The formation of third features 50 reduces the widths of gaps 74 to about $$\frac{2}{7}P_1.$$

Referring to FIG. 24, the fourth material 36 is formed within gaps 74, and over materials 21, 28 and 34.

Referring to FIG. 25, material 36 is subjected to an etch to remove material 36 from over materials 21, 28 and 34, and to thereby form a plurality of spaced-apart pedestals 78 from material 36. Each pedestal has a width of about $$\frac{2}{7}P_1.$$

The removal of material 36 from over materials 21, 28 and 34 may be accomplished with any suitable processing, including, for example, the "bird's beak" etch described above with reference to FIG. 7.

Referring to FIG. 26, etching is conducted to remove materials 21 and 34 (FIG. 23) selectively relative to materials 28 and 36. The etching utilized to selectively remove materials 21 and 34 may comprise any suitable etch or combination of etches, and in some embodiments may utilize one or both of $O_2$ and $SO_2$ to selectively remove organic materials relative to non-organic materials.

The features 30 and pedestals 78 together form a patterned mask 80 over base 12. The features 30 and pedestals 78 may be referred to as "structures" of the patterned mask 80. The patterned mask 80 may be referred to as a second patterned mask to distinguish it from the first patterned mask 70 of FIG. 19.

In the shown embodiment the second patterned mask 80 comprises some structures that are wider than others. Specifically, the structures corresponding to pedestals 78 are about twice as wide as the structures corresponding to features 30 (with the structures corresponding to pedestals 78 having widths of about $$\frac{2}{7}P_1,$$

while the structures corresponding to features 30 have widths of about $$\left.\frac{1}{7}P_1\right).$$

The variation in the widths of the various structures of mask 80 corresponds to variation in the widths of dark fields created by the mask. Such variation may be taken advantage of in applications in which it is desired to fabricate somewhat wide regions as landing pads for making contacts, while also fabricating somewhat narrow regions of compact integrated circuitry. Semiconductor dies may have memory array regions or other types of target regions where tightly packed circuitry is fabricated, and peripheral regions adjacent the target regions. The peripheral regions may have some tightly packed circuitry (for instance wiring or runners) and some less tightly packed circuitry (for instance, landing pads for contacts). An example architecture that may be utilized in the peripheral regions is shark jaw architecture. The utilization of different sized features may have particular suitability for fabrication of shark jaw or other architectures utilized in peripheral regions.

It may be useful to have different sized spaces between structures alternatively, or in addition to, having different sized structures of a patterned mask. FIGS. 27-29 describe an example embodiment in which a patterned mask has different sized spaces between structures.

Referring to FIG. 27, a construction 10d is shown at a processing stage analogous to that of FIG. 1. The construction 10d comprises a patterned mask 100 over base 12. The patterned mask 100 comprises a plurality of blocks 102 spaced apart from one another by gaps 104. In some embodiments, the blocks 102 may correspond to lines extending in and out of the page relative to the shown cross-section of FIG. 27.

The blocks 102 and gaps 104 are formed to a pitch $P_1$. However, unlike the construction of FIG. 1, the construction 10d of FIG. 27 comprises the blocks 102 having different widths than the gaps 104 between the blocks. Specifically, the blocks 102 have widths $$\frac{3}{8}P_1,$$

and the gaps 104 widths $$\frac{5}{8}P_1.$$

Referring to FIG. 28, features 30 of second material 28 are formed along sidewalls of blocks 102 with processing analogous to that described above with reference to FIGS. 3 and 4. The blocks 102 may be referred to as features in some embodiments; and in such embodiments the blocks 102 and the features 30 may be referred to as first and second features, respectively. It is noted that the lateral etching of the photoresist 21 (for instance, the lateral etching discussed above with reference to FIG. 2) is omitted in the shown example embodiment of FIGS. 27 and 28. Second features 30 have widths of about $$\frac{1}{8}P_1$$

in the illustrated example of FIG. 28.

Third features 50 of third material 34 are formed adjacent the second features 30, with the third features having a thickness of about $$\frac{1}{8}P_1.$$

The third features 50 may be formed with processing analogous to that discussed above with reference to FIGS. 22 and 23. The third features 50 reduce the widths of gaps 104 to about $$\frac{1}{8}P_1,$$

and pedestals 108 of fourth material 36 are utilized to fill such gaps. The pedestals 108 may be formed with processing analogous to that described above with reference to FIGS. 24 and 25. Each pedestal 108 has a width of about $$\frac{1}{8}P_1.$$

Referring to FIG. 29, etching is conducted to remove materials 21 and 34 (FIG. 28) selectively relative to materials 28 and 36. The etching utilized to selectively remove materials 21 and 34 may comprise any suitable etch or combination of etches, and in some embodiments may utilize one or both of $O_2$ and $SO_2$ to selectively remove organic materials relative to non-organic materials.

The features 30 and pedestals 108 together form a patterned mask 110 over base 12. The features 30 and pedestals 108 may be referred to as "structures" of the patterned mask 110. The patterned mask 110 may be referred to as a second patterned mask to distinguish it from the first patterned mask 100 of FIG. 27.

In the shown embodiment the second patterned mask 110 comprises some gaps that are wider than others. Specifically, some of the gaps are about three times as wide as others (with some of the gaps having widths of about $$\frac{3}{8}P_1,$$

while others have widths of about $$\frac{1}{8}P_1).$$

The variation in the widths of the various gaps of mask 110 corresponds to variation in the widths of light fields created by the mask. Such variation may be taken advantage of in applications in which it is desired to fabricate somewhat wide regions as landing pads for making contacts, while also fabricating somewhat narrow regions of compact integrated circuitry, analogously to the advantages discussed above with reference to FIG. 26 regarding variations of the widths of dark field regions.

The various pattern forming methods discussed above with reference to FIGS. 1-29 may be utilized for fabrication of integrated circuitry and/or micro-electro-mechanical systems (MEMS). The integrated circuitry may be utilized in any of numerous electronic systems, such as, for example, cellular phones, computers, cars, airplanes, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a patterned mask, comprising:
    forming spaced-apart first features over a semiconductor material, the first features comprising a first material and having sidewalls; the first features being spaced from one another by gaps;
    forming a second material along the sidewalls of the first features; the second material being compositionally different from the first material;
    forming a third material over the second material and the first features; the third material being compositionally different from the second material; the third material having a topography which defines recesses over segments of the gaps;
    forming a pedestals within said recesses; the pedestals comprising fourth material which is compositionally different from the third material;
    removing some of the second material from within the gaps to pattern the second material into a plurality of second features along the sidewalls of the first features; and
    removing the first features and at least some of the third material to leave a patterned mask comprising the second features in combination with other features defined by the pedestals.

2. The method of claim 1 wherein the patterning of the second material occurs prior to forming the third material.

3. The method of claim 1 wherein the patterning of the second material occurs after the removal of at least some of the third material.

4. The method of claim 1 wherein the first material comprises photoresist, the second material comprises silicon dioxide, and the fourth material comprises polymer containing silicon and/or one or more metals.

5. The method of claim 4 wherein the third material comprises carbon.

6. A method of forming a patterned mask, comprising:
    forming spaced-apart first features over a semiconductor material;
    forming second features along sidewalls of the first features; the first and second features comprising first and second materials, respectively, which are compositionally different from one another; the first and second features together forming a plurality of projections;
    forming a third material over the projections and between the projections; the third material having an undulating topography with peaks over the projections and valleys between the peaks; the third material being compositionally different from the second material;
    forming a fourth material within the valleys; the fourth material being compositionally different from the third material;
    subjecting the third material to an etch while using the fourth material as a mask to pattern the third material into a plurality of third features; and
    after patterning the third material into the third features, removing the first features to leave a patterned mask comprising the second and third features.

7. The method of claim 6 wherein:
    the first material comprises photoresist, the second material comprises silicon dioxide, the third material comprises carbon and the fourth material comprises polymer containing silicon and/or one or more metals; and
    the third material is at a temperature above a reflow temperature of the photoresist as the third material is formed.

8. The method of claim 6 wherein first features are all spaced from one another by about equal-distance gaps.

9. The method of claim 8 wherein the first features comprise photoresist and are formed by photolithographically patterning the photoresist to form a plurality of spaced apart blocks having a first pitch that is about a factor of three different from a pitch of the patterned mask comprising the second and third features.

10. A method of forming a patterned mask, comprising:
    forming spaced-apart photoresist features over a semiconductor material, the photoresist features having sidewalls, and being spaced from one another by gaps;
    forming a second material along the sidewalls of the photoresist features;
    removing some of the second material from within the gaps to pattern the second material into a plurality of second features along the sidewalls of the photoresist features; the photoresist features and the second features together forming a plurality of spaced-apart laminate structures;
    forming a third material over the laminate structures while leaving recesses extending to the base between the laminate structures; the third material being compositionally different from the second material;
    forming pedestals within the gaps; the pedestals comprising fourth material which is compositionally different from the third material; and
    after forming the fourth material, removing at least some of the third material and the photoresist features to leave a patterned mask comprising the second features and the pedestals.

11. The method of claim 10 wherein the photoresist has a reflow temperature, and wherein the third material is at a temperature above the reflow temperature as the third material is formed.

12. The method of claim 10 wherein the first features are formed by photolithographically patterning photoresist to form a plurality of spaced apart blocks having a first pitch that is about a factor of three different from a pitch of the patterned mask comprising the second features and pedestals.

13. The method of claim 10 wherein the second features and the pedestals comprise structures, and the structures are all substantially equally spaced from one another.

14. The method of claim 10 wherein the second features and the pedestals comprise structures, and the structures are not all substantially equally spaced from one another.

15. The method of claim 10 wherein the second features and pedestals are all about a same width as one another.

16. The method of claim 10 wherein the second features and pedestals are not all about a same width as one another.

* * * * *

UNITED STATES PATENT AND TRADEMARK OFFICE
CERTIFICATE OF CORRECTION

PATENT NO. : 8,476,002 B2
APPLICATION NO. : 13/609027
DATED : July 2, 2013
INVENTOR(S) : Zishu Zhang et al.

Page 1 of 1

It is certified that error appears in the above-identified patent and that said Letters Patent is hereby corrected as shown below:

On Title Page, Item (75), under "Inventors", column 1, line 4, delete "Meridian, IA (US)" and insert -- Meridian, ID (US) --, therefor.

On Title Page, Item (56), under "Other Publications", column 2, line 2, delete "Lithoography" and insert -- Lithography --, therefor.

Signed and Sealed this
Seventeenth Day of September, 2013

Teresa Stanek Rea
*Deputy Director of the United States Patent and Trademark Office*